United States Patent [19]

Iwabuchi et al.

[11] Patent Number: 4,733,097

[45] Date of Patent: Mar. 22, 1988

[54] HIGH SIGNAL TO NOISE RATIO OPTICAL IMAGE READER

[75] Inventors: Toshiyuki Iwabuchi; Masaaki Sakamoto, both of Tokyo, Japan

[73] Assignee: Oki Electric Industry Co., Ltd., Tokyo, Japan

[21] Appl. No.: 865,027

[22] Filed: May 20, 1986

[30] Foreign Application Priority Data

May 25, 1985 [JP] Japan .................. 60-112706

[51] Int. Cl.[4] .................. H01L 27/14; H04N 5/30
[52] U.S. Cl. .................. 250/578; 358/167; 358/213.15
[58] Field of Search .................. 250/578, 211 J, 209; 358/212, 213.15, 213.16, 167; 357/30 L, 30 H

[56] References Cited

U.S. PATENT DOCUMENTS

| | | | |
|---|---|---|---|
| 4,045,817 | 8/1977 | Nakatani et al. | 250/578 |
| 4,145,721 | 3/1979 | Beaudouin et al. | 358/213.15 |
| 4,300,163 | 11/1981 | Wada et al. | 358/213.15 |
| 4,511,804 | 4/1985 | Ozawa | 250/578 |

Primary Examiner—Edward P. Westin
Attorney, Agent, or Firm—Wenderoth, Lind & Ponack

[57] ABSTRACT

An optical image reader includes plural pairs of switches, each pair of switches having a CMOS structure signal switch and a CMOS structure dummy switch, plural photosensing elements each corresponding to each pair of switches, plural inverters each corresponding to each pair of switches, a signal line, a dummy line, a shift register and a differential amplifier. A first switch terminal of each signal switch is connected to the corresponding photosensing element, and a second switch terminal thereof is connected to one input terminal of the differential amplifier through the signal line. A first switch terminal of each dummy switch is connected to another input terminal of the differential amplifier through the dummy line, and a second switch terminal thereof is in an open state. A first control terminal of each signal switch is connected to a first control terminal of corresponding each dummy switch, an input terminal of the corresponding inverter, and a corresponding output terminal of the shift register. A second control terminal of each signal switch is connected to a second control terminal of the corresponding dummy switch and an output terminal of the corresponding inverter. By applying a scanning pulse to each pair of switches for switching them from the shift register, an output of a photo signal and a spike noise appears on the signal line, and an output of a spike noise appears on the dummy line. These outputs are differentially amplified by the differential amplifier.

5 Claims, 7 Drawing Figures

C-MOS SWITCH

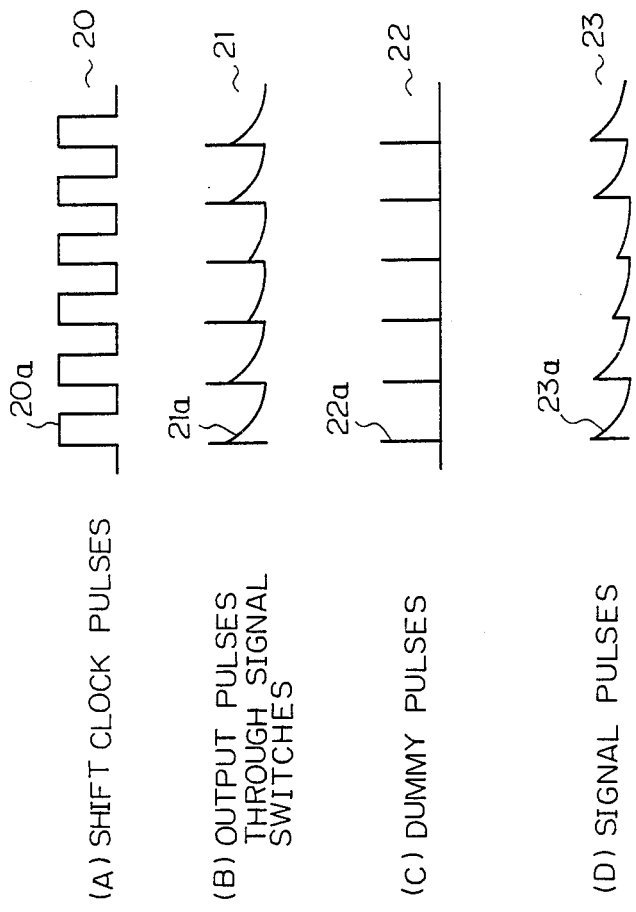

HIGH SIGNAL TO NOISE RATIO OPTICAL IMAGE READER

BACKGROUND OF THE INVENTION

1. Field of the Invention

This invention relates to improvements of an optical image reader for use in a facsimile system, an optical character recognition (OCR) system, a copier and the like.

2. Description of the Related Art

An optical image reader has been developed for use in a facsimile system, an OCR system, a copier and the like.

U.S. Pat. No. 4,045,817 discloses such a conventional optical image reader operating in a charge storage mode. This conventional optical image reader comprises a plurality of photosensing elements $PD_1, \ldots, PD_n$, a plurality of MOS transistor switches (MOS switches) $M_1, \ldots M_n$, a plurality of MOS capacitors $MC_1$, load resistors $RL_1$ and $RL_2$, a power source and a scanning pulse generator. In this optical image reader, each photosensing element is connected to a source electrode of the corresponding MOS switch. The signal line is commonly connected to the drain electrodes of the MOS switches. A gate electrode of each MOS capacitor is connected to a gate electrode of the corresponding MOS switch and a corresponding output terminal of the scanning pulse generator. Each drain electrode of MOS capacitors is commonly connected to the noise line. These signal and noise lines are respectively connected to the input terminals of the differential amplifier, and further respectively connected to the power source through load resistors $RL_1$ and $R_2$.

By applying a scanning pulse to the gate electrode of each MOS switch sequentially from the scanning pulse generator, each MOS switch is turned on sequentially. Then, a photo-signal from the photosensing element and a spike noise from the MOS switch appear on the signal line. At the same time, a spike noise from the MOS capacitor appears on the noise line. These outputs which appear on the signal and noise lines are differentially amplified by the differential amplifier. The MOS switch used in this conventional image reader has a P channel MOS structure, or an N channel MOS structure. FIGS. 1(A) and 1(B) show the ON-resistance characteristics of the P channel MOS switch and the N channel MOS switch respectively. As is apparent from FIGS. 1(A) and 1(B), the ON-resistance of the MOS switch becomes high as its input voltage approaches a gate voltage which is $V_{DD}$ in the N channel MOS switch or $V_{SS}$ in the P channel MOS switch. This phenomenon has a bad influence on the switching of the MOS switch. Thus, the voltage range of the MOS switch must be limited to a certain range which is free from the influence.

SUMMARY OF THE INVENTION

An object of the present invention is to provide an optical image reader having a high signal to noise ratio.

Another object of the present invention is to provide an optical image reader enabling one to read images on a document with a high fidelity.

The optical image reader of the invention operates in a charge storage mode.

The optical image reader of the present invention comprises an array of photosensing elements having a plurality of photosensing elements, a plurality of signal switches each composed of a complementary MOS switch respectively corresponding to one of the plurality of photosensing elements, a plurality of dummy switches each composed of a complementary MOS switch respectively corresponding to one of the plurality of signal switches, a plurality of inverters each respectively corresponding to one of the pluralities of signal switches and dummy switches, a scanning pulse generating means, a differential amplifier, a signal common line and a dummy common line.

The signal switch and the dummy switch have the same structure respectively composed of a complementary MOS switch. Each of the signal switches and each of the dummy switches are respectively combined to constitute a pair of switches.

Each pair of switches respectively correspond to a photosensing element. The complementary MOS switch used as the signal switch or the dummy switch has a structure comprising a P channel MOS switch element and an N channel MOS switch element connected in parallel thereto.

This complementary MOS switch has a first switch terminal, a second switch terminal, a first control terminal and a second control terminal. The first switch terminal of each signal switch is respectively connected to a corresponding one of the photosensing elements, and the second switch terminal thereof is commonly connected to the signal common line.

The first switch terminal of each dummy switch is commonly connected to the dummy common line, and the second switch terminal thereof is in an open state respectively. The first control terminal of each signal switch is connected to the first control terminal of the corresponding one of the dummy switches, an input terminal of the corresponding one of the inverters, and an corresponding output terminal of the scanning pulse generating means. The second control terminal of each signal switch is connected to the second control terminal of the corresponding one of the dummy switches and an output terminal of the corresponding one of the inverters.

The signal common line and the dummy common line are respectively connected to the corresponding input terminals of the differential amplifier. Each photosensing element is reverse-biased.

When scanning pulses are applied sequentially to each pair of switches composed of a signal switch and dummy switch, each pair of switches are turned on sequentially.

By turning on the signal switch, a photo signal current from the photosensing element is outputted to the signal common line through the signal switch, and a spike noise generated in the signal switch is also outputted at the same time. These composite outputs are inputted to one input terminal of the differential amplifier.

By turning on the dummy switch, the spike noise generated in the dummy switch is outputted to the dummy common line. This spike noise is inputted to another input terminal of the differential amplifier.

These outputs delivered by the signal common line and the dummy common line are differentially amplified by the differential amplifier. As the result, the differential amplifier outputs a signal which is free from the spike noise.

Since the signal switch and the dummy switch respectively have a complementary MOS structure, the spike noise is suppressed in each switch itself. The complementary MOS switch has a flat ON-resistance characteristic and a wide range of operating voltages.

Furthermore, in the complementary MOS switch, a high level signal voltage is not clipped at a threshold voltage.

Thus, the optical image reader according to the present invention has a high signal to noise ratio, and enables one to read images on a document with a high fidelity.

For a better understanding of the invention, reference is made to the following detailed description of the invention given in connection with the acompanying drawings. In the drawings:

BRIEF DESCRIPTION OF THE DRAWINGS

FIG. 6 is a waveform chart of outputs in several parts of the optical image reader.

DETAILED DESCRIPTION OF PREFERRED EMBODIMENTS

Figure 2:
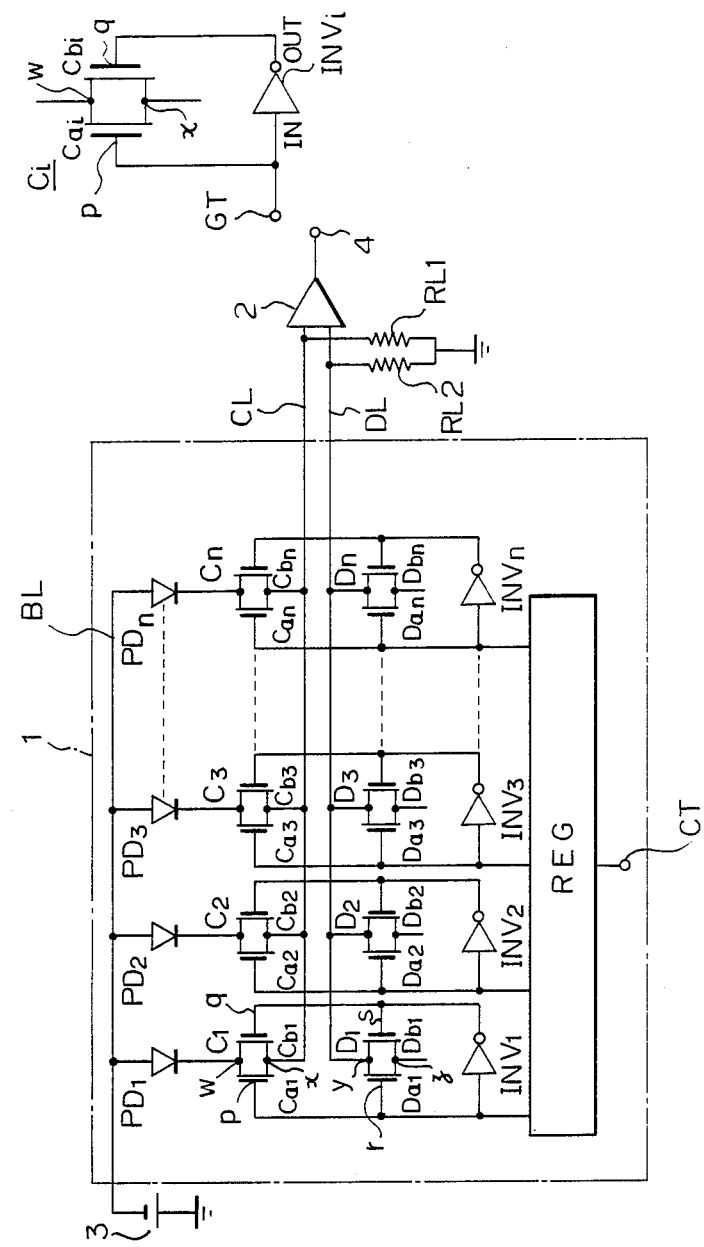
FIG. 2 is a circuit diagram of an optical image reader according to the present invention.

FIG. 2 shows a schematic circuit diagram of an optical image reader of the present invention. The optical image reader operates in a charge storage mode.

The optical image reader comprises an image sensor 1, a differential amplifier 2, a bias power source 3, load resistors $RL_1$ and $RL_2$, and an output terminal 4. The image sensor 1 comprises an array of photosensing elements having a plurality of photosensing elements PDi- ($i=1, 2, \ldots, n$) arranged in a single straight line for converting a reflected light from a document to photocurrents, a plurality of signal switches Ci($i=1, 2, \ldots, n$) each of which is composed of a complementary metal oxide semiconductor (complementary MOS, or CMOS) switch having an N channel MOS (N-MOS) switch element Cai($i=1, 2, \ldots, n$) and a P channel MOS (P-MOS) switch element Cbi($i=1, 2, \ldots, n$), a plurality of dummy switches Di($i=1, 2, \ldots, n$) each of which is also composed of a CMOS switch having an N-MOS switch element Dai($i=1, 2, \ldots, n$) and a P-MOS switch element Dbi($i=1, 2, \ldots, n$), a plurality of inverters INVi($i=1, 2, \ldots, n$) each corresponding to one of the signal switches Ci and one of the dummy switches Di, a shift register REG used as a scanning pulse generating means, a bias common line BL, a signal common line CL and a dummy common line DL.

An anode of each photosensing element Pdi is commonly connected to the bias common line BL, and the bias common line BL is connected to a negative terminal of the power source 3 for reverse-biasing the photosensing elements PDi. A positive terminal of the power source 3 is grounded.

A first switch terminal w of each signal switch Ci is connected to a cathode of a corresponding photosensing element PDi, and a second switch terminal x thereof is commonly connected to the signal common line CL. Each of the signal switches Ci and a corresponding one of the dummy switches Di are combined to constitute a pair of switches. For constitutuing a pair of switches, a first control terminal p of each signal switch Ci is connected to a first control terminal r of a corresponding dummy switch Di, and a second control terminal q thereof is connected to a second control terminal s of the corresponding dummy switch Di.

A first switch terminal y of each dummy switch Di is commonly connected to the dummy common line DL, and a second switch terminal z thereof is in an open state. The first control terminals p and r are further respectively connected to an input terminal of the corresponding inverter INVi and a corresponding output terminal of the shift register REG.

The second control terminals q and s are further respectively connected to an output terminal of the corresponding inverter INVi.

The signal common line and the dummy common line are respectively connected to terminals of the load resistors $RL_1$ and $RL_2$ and the corresponding input terminals of the differential amplifier 2. Other terminals of the load resistors $RL_1$ and $RL_2$ are grounded respectively.

Figure 1A:
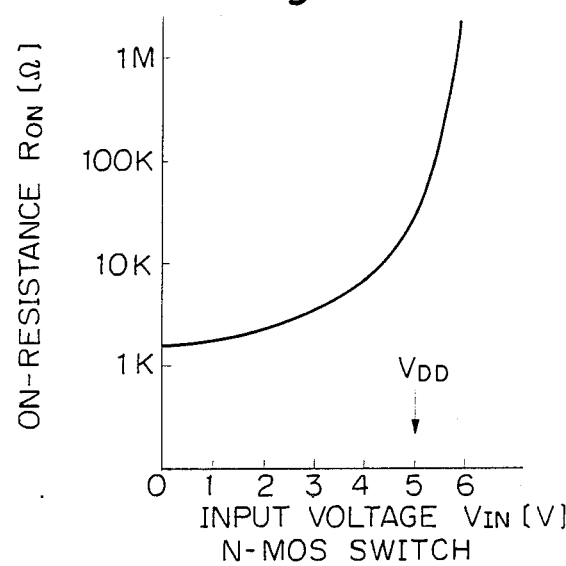
FIGS. 1(a) and 1(B) are graphs of the ON-regristance characteristics of a P channel MOS switch element and an N channel MOS switch element respectively.
Figure 1B:
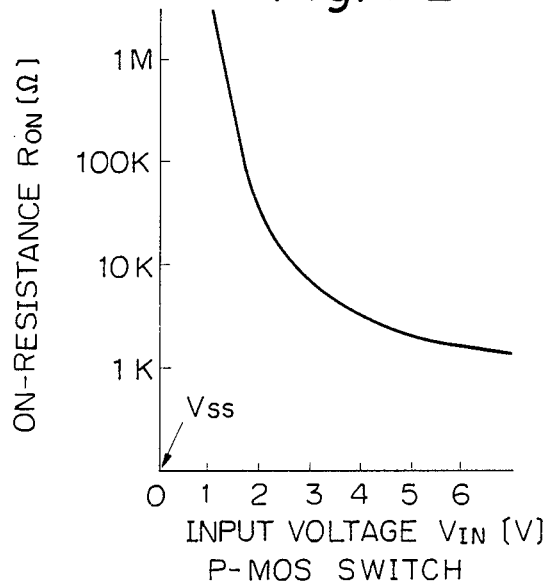
Figure 3:
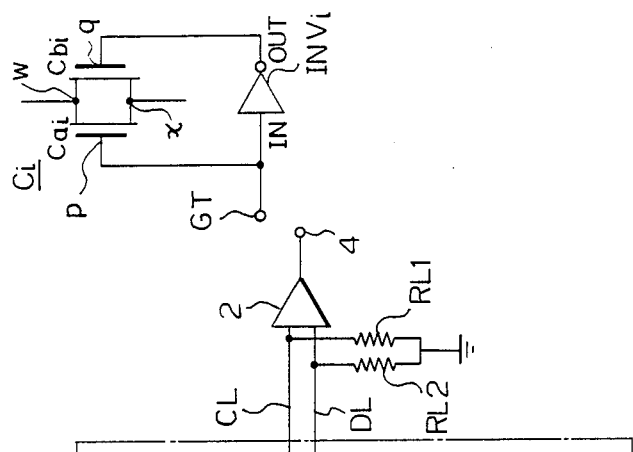
FIG. 3 is a circuit diagram of a complementary MOS switch.

Referring to FIG. 3, a structure of the signal switch Ci or the dummy switch Di will now be described in detail.

Since the signal switch Ci and the dummy switch Di have the same structure, only the structure of the signal switch Ci will now be described.

The signal switch Ci is constituted by a CMOS switch having an N-MOS switch element Cai and an P-MOS switch element Cbi connected in parallel.

Source electrodes w of both switch elements Cai and Cbi are connected together, and drain electrodes x thereof are also connected together. A gate electrode p of the N-MOS switch element Cai is connected to the input terminal of the inverter INVi and a gate control terminal GT. A gate electrode q of the P-MOS switch element Cbi is connected to the output terminal of the inverters INVi.

When a predetermined postive voltage with respect to ground is supplied to the gate control terminal GT, the positive voltage is supplied to the gate electrode p of the switch element Cai, and the ground voltage is applied to the gate electrode q of the switch element Cbi. Thus, both switch elements Cai and Cbi are turned on at the same time, that is, the signal switch Ci is turned on.

On the other hand, when the ground voltage is supplied to the gate control terminal GT, the ground voltage is supplied to the gate electrode p of the switch element Cai, and the positive voltage is supplied to the gate electrode q of the switch element Cbi. Thus, both switch elements Cai and Cbi are turned off at the same time, that is, the signal switch Ci is turned off.

As described above, in the CMOS switch as the signal switch Ci, the N-MOS switch element Cai and the P-MOS switch element Cbi are turned on and off by reverse phase gate signals. Spike noise due to the gate-drain capacitance of both switch elements Cai and Cbi are generated in opposite directions with respect to each other. Thus, since the spike noise generated in both switch elements Cai and Cbi cancel each other, the spike noise issued from the CMOS switch is essentially suppressed.

Figure 4:
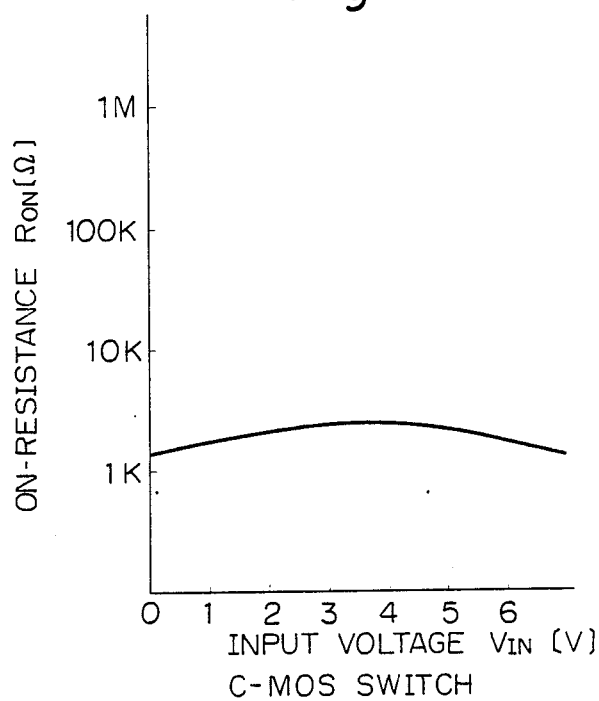
FIG. 4 is a graph of an ON-resistance characteristic of the complementary MOS switch.

Furthermore, since the CMOS switch has a flat ON-resistance characteristic as shown in FIG. 4, the CMOS switch has a wide operating voltage.

In the CMOS switch, a signal voltage is not clipped at high levels thereof. Thus, the CMOS switch is suitable for a switch of the photosensing element.

Figure 5:
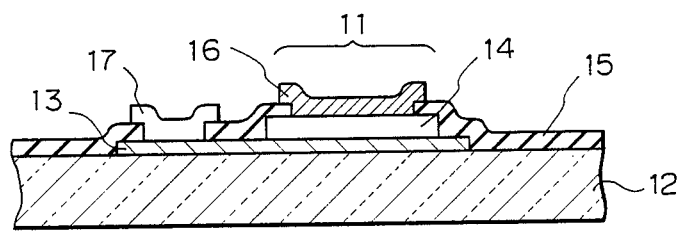
FIG. 5 is a side elevation view of a photosensing portion of the optical image reader.

Referring now to FIG. 5, a structure of a photosensing portion of the image sensor 1 will now be described in detail.

FIG. 5 shows a side elevation view of the photosensing elements array.

In FIG. 5, reference numeral 11 denotes the photosensing elements each being composed of an amorphous silicon p-i-n type photodiode. Reference numeral 12 denotes a transparent sensor plate composed of glass, synthetic resin, or other preferred materials. Reference numeral 13 denotes a transparent electrode, which is formed on the sensor plate 12.

The transparent electrode 13 can be formed of a transparent conductive material such as indium tin oxide (ITO). The electrode 13 composed of ITO can be made in oxygen atmosphere by electron beam evaporation or sputtering evaporation of a mixture of indium and about 5% of tin oxide. Where a photosensing layer described later is made of amorphous silicon, the electrode 13 can be made of a two layered film comprising a tin oxide film deposited on an indium tin oxide film.

Reference numeral 14 denotes the photosensing layer which is made of a three layered amorphous silicon film comprising a p-type layer, an i-type layer and an n-type layer, which are laminated on the electrode 13 in the recited order.

The photosensing layer 14 is prepared by glow discharge decomposition of silane ($SiH_4$) doped with diborane ($B_2H_6$) or phosphine ($PH_3$) to produce the p-type, i-type and n-type layers. The temperature used in this preparation can be as low as 200°–300° C. The p-type layer is formed to the thickness of 50–1000 Å by using a mixture of 500–10,000 ppm of diborane gas to silane gas. The i-type layer is formed on the p-type layer to the thickness of 0.5–1.5 um by using a mixture of diborane gas less than 100 ppm to silane gas. The n-type layer is formed on the i-type layer to the thickness of 100–2000 Å by using a mixture of 500–10,000 ppm phosphine gas to silane gas. Then, the photosensing layer is etched to a predetermined shape in a gas pressure of 10–100 Pa by means of a plasma etching method using etching gas which is a mixture of 3–15% oxygen to carbon tetrafluoride ($DF_4$). Where the image sensor has a reading resolution of 8 dots/mm and the length corresponding to the width of a B-4 size document, the photosensing elements array is composed of 2048 photosensing elements arranged in a single straight line, each of which has a shape of about a 100 um square.

Then, an insulating layer 15 is formed on the photosensing layer 14 and the electrode 13. Preferrably the insulating layer 15 is formed by a glow discharging method, because the same glow discharging equipment can be used as in forming the photosensing layer 14. The insulating layer can be made of a high resistance material such as silicon oxide (SiOx), silicon nitride (SiNx), alumina ($Al_2O_3$) or the like.

Then, the insulating layer 15 is selectively etched to expose predetermined portions of the photosensing layer 14 and the electrode 13. Metal electrodes 16 and 17 made of aluminum or nichrome are deposited so as to cover the exposed portions of the photosensing layer 14 and the transparent electrode 13 respectively. As a result, the metal electrode 16 used as a cathode is connected to the photosensing layer 14, and the metal electrode 17 used as an anode is connected to the transparent electrode 13. Thus, the photosensing elements shown in FIG. 5 are completed.

As is apparent from FIG. 5, a light L iluminates the photosensing layer 14 through the transparent sensor plate 12 and the transparent electrode 13.

By the way, the photosensing layer can be composed of other photosensing materials instead of amorphous silicon.

Referring now to FIG. 6, the operation of the optical image reader shown in FIG. 2 will be described in detail.

In FIG. 6, a waveform (A) shows shift clock pulses 20 supplied to the clock input terminal CT of the shift register REG. A waveform (B) shows output pulses 21, each comprising the signal component and the noise component, appearing on the signal common line CL through each signal switch Ci from each photosensing element. A waveform (C) shows dummy pulses 22, each being equal to the noise component, appearing on the dummy common line DL due to the switching of each dummy switch Di. A waveform (D) shows the resulting signal pulses 23 output from the differential amplifier 2.

The optical image reader operates in the charge storage mode.

When shift clock pulses 20 are supplied to the clock input terminal CT of the shift register REG, the shift register REG outputs signals for driving each pair of switches sequentially. For example, when a first shift clock pulse 20a is supplied to the clock input terminal CT, the shift register REG outputs a first scanning pulse to turn on the two switch elements Ca1 and Cb1 of the first signal switch C1 and the two switch elements Da1 and Db1 of the first dummy switch D1 simultaneously, so that the signal switch C1 and the dummy switch D1 are turned on simultaneously.

Then, an output pulse 21a appears on the signal common line CL, and a dummy pulse 22a appears on the dummy common line DL.

The output pulse 21a comprises a photo signal used as a charging current to the photosensing element PD1 in the charge storage mode and a spike noise due to the switching of the signal switch C1.

The dummy pulse 22a comprises only a spike noise due to the switching of the dummy switch D1, because the second terminal z of the dummy switch D1 is in an open state.

Then, the output pulse 21a and the dummy pulse 22a are supplied to the differential amplifier 2 to output a signal pulse 23a as a differential output. In the signal pulse 23a, the spike noise component of the output pulse 21a has been canceled by the dummy pulse 22a.

Thus, the signal pulse 23a shown in the waveform (D) of FIG. 6 is output as a reading result from the output terminal 4 of the differential amplifier 2.

The signal pulse 23a is equivalent to the photo signal component of the output pulse 21a.

Then, the reading of the photo signal of the photosensing element PD1 is completed.

Afterward, the shift register REG is responsive to subsequent shift clock pulses to output scanning pulses sequentially for switching of each pair of switches comprising the signal switch Ci (i=2, 3, ..., n) and the dummy switch Di (i=2, 3, ..., n).

Each pair of switches is responsive to the sequential scanning pulses to be turned on sequentially, and the detection of the photo signal of each photosensing element PDi (i=2, 3.

As mentioned above in detail, since the optical image reader of the invention comprises the signal and dummy switches each comprising CMOS switches, the spike noise is suppressed in each CMOS switch itself. Moreover, the CMOS switch has a wide range of the operating voltage, and the signal voltage in the CMOS switch is not clipped when at a high level thereof.

Thus, the optical image reader of the invention has a high signal to noise ratio in comparison with the conventional optical image reader, so that the optical image reader of the invention can read images on a document with a high fidelity.

Furthermore, it is easy to fabricate an integrated circuit of the image sensor comprising the photosensing elements, the signal switches, the dummy switches, the shift register and the like, so that the optical image reader of the present invention can be of a smallsize and light weight.

From the foregoing, it will now be apparent that a new and improved optical image reader is realized. It should be understood that the embodiments disclosed are merely illustrative and are not intended to limit the scope of the present invention. Reference should be made to the appended claims, therefore, rather than the specification as indicating the scope of the present invention.

What is claimed is:

1. An optical image reader for reading a document, comprising:
    an array of photosensing elements comprising a plurality of photosensing elements;
    a signal common line;
    a dummy common line;
    a plurality of signal switches each corresponding to each photosensing element, each switch being composed of a complementary MOS switch comprising a P channel MOS switch element and an N channel MOS switch element connected in parallel with each other, each switch having a first switch terminal, a second switch terminal, a first control terminal and a second control terminal, the first switch terminal of each signal switch being connected to the corresponding photosensing element and the second switch terminal thereof being commonly connected to the signal common line;
    a plurality of dummy switches each combining with the corresponding signal switch to constitute a pair of switches, each dummy switch being composed of a complementary MOS switch comprising a P channel MOS switch element and an N channel MOS switch element connected in parallel thereto, each dummy switch also having a first switch terminal, a second switch terminal, a first control terminal and a second control terminal, the first switch terminal of each dummy switch being commonly connected to the dummy common line, the second switch terminal thereof keeping an open state, the first control terminal thereof being connected to the first control terminal of the corresponding signal switch, and the second control terminal thereof being connected to the second control terminal of the corresponding signal switch;
    a plurality of inverters each corresponding to each pair of switches, each inverter having an input terminal and an output terminal, the input terminal of each inverter being connected to the first control terminals of the corresponding signal switch and dummy switch, and the output terminal thereof being connected to the second control terminals of the corresponding signal switch and dummy switch;
    a scanning pulse generating means for providing scanning pulses to each pair of switches comprising the signal switch and dummy switch, having plural output terminals each being connected to the input terminal of the corresponding inverter and the first switch terminal of the corresponding signal switch and dummy switch; and
    a differential amplifier having two input terminals being connected to the signal common line and the dummy common line respectively for detecting the difference between an output delivered from the signal common line and an output delivered from the dummy common line.

2. An optical image reader according to claim 1, wherein the photosensing element is composed of an amorphous silicon p-i-n type photodiode.

3. An optical image reader according to claim 1, wherein the photosensing elements array comprises a plurality of photosensing elements arranged in a single straight line and has a length at least equal to the width of the document.

4. An optical image reader according to claim 1, wherein the first switch terminal of the signal switch or the dummy switch comprises source electrodes of both the P channel MOS switch element and the N channel MOS switch element connected together, and the second switch terminal thereof comprises drain electrodes of both the P channel MOS switch element and the N channel MOS switch element connected together, and the first control terminal thereof comprises a gate electrode of the P channel MOS switch element, and the second control terminal thereof comprises a gate electrode of the N channel MOS switch element.

5. An optical image reader according to claim 1, wherein the differential amplifier amplifies the difference between the output delivered from the signal common line and the output delivered from the dummy common line.

* * * * *